(12) United States Patent
Nomiyama et al.

(10) Patent No.: US 11,485,906 B2
(45) Date of Patent: Nov. 1, 2022

(54) PHOSPHOR PARTICLE, COMPOSITE, LIGHT-EMITTING DEVICE, AND METHOD FOR PRODUCING PHOSPHOR PARTICLE

(71) Applicant: DENKA COMPANY LIMITED, Tokyo (JP)

(72) Inventors: Tomohiro Nomiyama, Tokyo (JP); Yusuke Takeda, Tokyo (JP); Marina Takamura, Tokyo (JP); Tatsuya Okuzono, Tokyo (JP); Masaru Miyazaki, Tokyo (JP); Shintaro Watanabe, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/599,631

(22) PCT Filed: Mar. 24, 2020

(86) PCT No.: PCT/JP2020/013104
§ 371 (c)(1),
(2) Date: Sep. 29, 2021

(87) PCT Pub. No.: WO2020/203485
PCT Pub. Date: Oct. 8, 2020

(65) Prior Publication Data
US 2022/0089946 A1 Mar. 24, 2022

(30) Foreign Application Priority Data

Mar. 29, 2019 (JP) .............................. JP2019-069106

(51) Int. Cl.
*C09K 11/77* (2006.01)
*C01B 21/082* (2006.01)
(Continued)

(52) U.S. Cl.
CPC .... *C09K 11/77348* (2021.01); *C01B 21/0826* (2013.01); *C09K 11/02* (2013.01);
(Continued)

(58) Field of Classification Search
CPC ................................. C09K 11/77348
See application file for complete search history.

(56) References Cited

U.S. PATENT DOCUMENTS 8,404,152 B2 3/2013 Emoto et al.
9,464,226 B2 10/2016 Sakata et al.
(Continued)

FOREIGN PATENT DOCUMENTS

JP 2009-096882 A 5/2009
JP 2016-050208 A 4/2016
(Continued)

OTHER PUBLICATIONS

Jun. 9, 2020 International Search Report issued in International Patent Application No. PCT/JP2020/013104.
(Continued)

*Primary Examiner* — Matthew E. Hoban
(74) *Attorney, Agent, or Firm* — Oliff PLC

(57) ABSTRACT

An α-sialon phosphor particle containing Eu. At least one minute recess is formed on a surface of the α-sialon phosphor particle. The α-sialon phosphor particle is preferably produced by undergoing a raw material mixing step, a heating step, a pulverizing step, and an acid treatment step.

9 Claims, 8 Drawing Sheets

(51) Int. Cl.
*C09K 11/02* (2006.01)
*H01L 33/50* (2010.01)

(52) U.S. Cl.
CPC ........ *H01L 33/502* (2013.01); *C01P 2002/54* (2013.01); *C01P 2004/03* (2013.01)

(56) References Cited

U.S. PATENT DOCUMENTS

| | | | |
|---|---|---|---|
| 9,570,655 | B2 | 2/2017 | Yoshimura et al. |
| 9,711,686 | B2 | 7/2017 | Yoshimura et al. |
| 10,266,766 | B2 | 4/2019 | Emoto |
| 2006/0208260 | A1* | 9/2006 | Sakuma ............. C09K 11/0883 257/76 |
| 2009/0021141 | A1 | 1/2009 | Emoto et al. |
| 2010/0053932 | A1 | 3/2010 | Emoto et al. |
| 2011/0133629 | A1 | 6/2011 | Sakata et al. |
| 2013/0285104 | A1 | 10/2013 | Yoshimura et al. |
| 2014/0197362 | A1 | 7/2014 | Industries Ltd |
| 2016/0204311 | A1 | 7/2016 | Yoshimura et al. |
| 2016/0280994 | A1* | 9/2016 | Emoto ................. H01L 33/502 |

FOREIGN PATENT DOCUMENTS

| | | |
|---|---|---|
| WO | 2008/062781 A1 | 5/2008 |
| WO | 2010/018873 A1 | 2/2010 |
| WO | 2012/098932 A1 | 7/2012 |
| WO | 2014/077240 A1 | 5/2014 |

OTHER PUBLICATIONS

Feb. 11, 2022 Office Action issued in German Patent Application No. 112020001624.2.

K. Shioi et al. "Photoluminescene and thermal stability of yellow-emitting Sr-a-SiAlON:Eu2+phosphor". Journal of Material Science. vol. 45, Mar. 2010, pp. 3198-3203.

* cited by examiner

PHOSPHOR PARTICLE, COMPOSITE, LIGHT-EMITTING DEVICE, AND METHOD FOR PRODUCING PHOSPHOR PARTICLE

TECHNICAL FIELD

The present invention relates to a phosphor particle, a composite, a light-emitting device, and a method for producing the phosphor particle.

BACKGROUND ART

As nitride and oxynitride phosphors, an α-sialon phosphor in which a specific rare earth element is activated is known to have useful fluorescence characteristics, and has been applied to a white LED and the like. The α-sialon phosphor has a structure in which Si—N bonds of α-silicon nitride crystals are partially substituted with Al—N bonds and Al—O bonds, and specific elements (Ca, Li, Mg, Y, or lanthanide metals except for La and Ce) penetrate into crystal lattices and are solid-dissolved in order to maintain electrical neutrality. The fluorescence characteristics are expressed by using some of the elements that penetrate into the lattices and are solid-dissolved as a rare earth element serving as a luminescent center. Among those, the α-sialon phosphor, in which Ca is solid-dissolved and the elements are partially substituted with Eu, is relatively efficiently excited in a wide wavelength range from ultraviolet to blue light and exhibits emission of yellow to orange light. As an attempt to further improve the fluorescence characteristics of such an α-sialon phosphor, for example, it has been proposed to select an α-sialon phosphor having a specific average particle diameter by a classification treatment (Patent Document 1).

RELATED DOCUMENT

Patent Document

[Patent Document 1] Japanese Laid-open Patent Publication No. 2009-96882

SUMMARY OF THE INVENTION

Technical Problem

The present inventors have conducted intensive studies on an improvement of the fluorescence characteristics of an α-sialon phosphor, and have thus found that the fluorescence characteristics of the α-sialon phosphor vary depending on the surface shape of an α-sialon phosphor particle. Furthermore, as a result of a progress in the studies on what kind of surface shape contributes to the fluorescence characteristics of the α-sialon phosphor, the present invention has been completed.

The present invention has been made in view of such circumstances. The present invention provides a technique for further improving the fluorescence characteristics of the α-sialon phosphor particle.

Solution to Problem

According to the present invention, there are provided an α-sialon phosphor particle containing Eu, in which at least one minute recess is formed on a surface of the α-sialon phosphor particle.

Furthermore, according to the present invention, there is provided a composite including the above-mentioned phosphor particles and a sealing material that seals the phosphor particles.

In addition, according to the present invention, there is provided a light-emitting device including a light-emitting element that emits excitation light, and the above-mentioned composite that converts a wavelength of the excitation light.

Furthermore, according to the present invention, there is provided a method for producing the above-mentioned phosphor particle, the method including a mixing step of mixing raw material containing an element constituting an α-sialon phosphor particle containing Eu, a heating step of heating a mixture of the raw materials to obtain an α-sialon phosphor, a pulverizing step of pulverizing the α-sialon phosphor obtained by the heating step to obtain the α-sialon phosphor particle, and a step of subjecting the α-sialon phosphor particle obtained by the pulverizing step to an acid treatment to form a minute recess on a surface of the α-sialon phosphor particle.

Advantageous Effects of Invention

According to the present invention, the fluorescence characteristics of an α-sialon phosphor particle can be improved.

DESCRIPTION OF EMBODIMENTS

Figure 1:
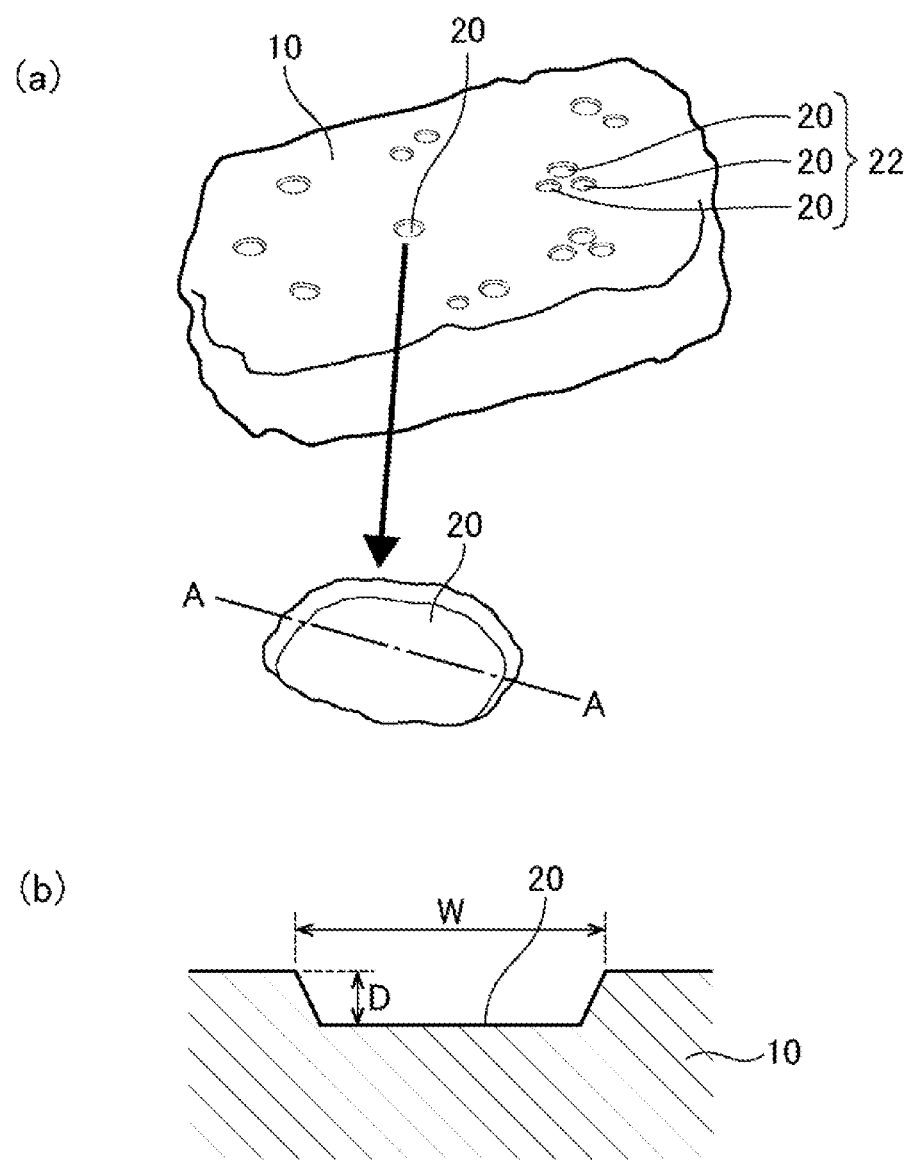
FIG. 1(a) is a schematic view of a minute recess provided on the surface of the α-sialon phosphor particle.
FIG. 1(b) is a schematic view of a minute recess in a cross-section taken along the line A-A of FIG. 1(a).

Hereinafter, embodiments of the present invention will be described in detail.

The phosphor particle according to an embodiment is formed of an α-sialon phosphor particle containing Eu as an activating substance. At least one minute recess is formed on the surface of each of the α-sialon phosphor particles.

Here, the minute recess is a crater-like recess (provided that an edge of the recess does not need to be swollen) formed on the surface of each of the α-sialon phosphor particles, in which the recess has a diameter of a micron to submicron level and a depth of a submicron level.

Furthermore, an aggregate (powder) including the phosphor particles according to the embodiment may include α-sialon phosphor particles in which the above-mentioned minute recess is not formed on the surface of each of the particles.

With the α-sialon phosphor particle of the present embodiment, it is possible to improve the fluorescence characteristics while maintaining the excitation wavelength range and the fluorescence wavelength range of an α-sialon phosphor particle in the related art. Therefore, as a result, the light emission characteristics of a light-emitting device using the α-sialon phosphor particle can be improved.

Detailed mechanism as a reason therefor is not clear but, for example, a minute recess formed on the surface of the α-sialon phosphor particle maybe a recess structure which is characteristic as a trace obtained by the removal of a heterogeneous phase that does not contribute to fluorescence. It is presumed that in the α-sialon phosphor particles in which such a minute recess is formed, a heterogeneous phase which does not contribute to fluorescence is extensively removed even on the surface of each of the α-sialon phosphor particles other than a region in which the minute recess is formed. As a result, it is considered that the fluorescence characteristics of the α-sialon phosphor particle are improved by increasing the proportion of mother crystals of a phosphor which contributes to fluorescence on the surface of the α-sialon phosphor particle.

In addition to this, it is considered that light incident in the minute recess is taken into the inside of the α-sialon phosphor particle and efficiently taken out therefrom, and as a result, the fluorescence characteristics of the α-sialon phosphor particles are improved.

α-Sialon Phosphor Particle

The α-sialon phosphor particle containing Eu is formed of an α-sialon phosphor which will be described below.

The α-sialon phosphor is an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 are one or more divalent elements selected from the group consisting of Mg, Ca, and lanthanide elements (except for La and Ce)).

The solid dissolution composition of the α-sialon phosphor is expressed in x, y, and z in the general formula, and m and n determined by an Si/Al ratio and an O/N ratio associated therewith, and satisfies $0 \leq x < 2.0$, $0 \leq y < 2.0$, $0 < z \leq 0.5$, $0 < x+y$, $0.3 + y + z \leq 2.0$, $0 < m \leq 4.0$, and $0 < n \leq 3.0$. In particular, in a case where Ca is used as M2, the α-sialon phosphor is stabilized in a wide composition range. In particular, by partially substituting the elements of Ca with Eu which is a luminescent center, excitation occurs by light in a wide wavelength range from ultraviolet to blue light, whereby a phosphor exhibiting emission of visible light ranging from yellow to orange light can be obtained.

From the viewpoint of obtaining light in bulb color in illumination applications, it is preferable that the α-sialon phosphor does not include Li as a solid dissolution composition, or includes a small amount of L, if any. In terms of the general formula, it is preferable to satisfy $0 \leq x \leq 0.1$. Furthermore or alternatively, a ratio of Li in the α-sialon phosphor particles is preferably equal to or more than 0% by mass and equal to or less than 1% by mass.

In general, the α-sialon phosphor has a second crystal phase different from that of the α-sialon phosphor or an amorphous phase which is inevitably present, the solid dissolution composition cannot be strictly defined by composition analysis or the like. As a crystal phase of the α-sialon phosphor, an α-sialon single phase is preferable, and the α-sialon phosphor may also include aluminum nitride or a polytypoid or the like thereof as another crystal phase.

In the α-sialon phosphor particles, a plurality of equi-axed primary particles are sintered to form aggregated secondary particles. The primary particles in the present embodiment refer to the smallest particles observable with an electron microscope or the like, in which the particles can exist singly.

The lower limit of the average particle diameter of the α-sialon phosphor particles is preferably equal to or more than 1 μm, more preferably equal to or more than 5 μm, and still more preferably equal to or more than 10 μm. In addition, the upper limit of the average particle diameter of the α-sialon phosphor particles is preferably equal to or less than 30 μm, and more preferably equal to or less than 20 μm. The average particle diameter of the α-sialon phosphor particles is a dimension for the secondary particles. By setting the average particle diameter of the α-sialon phosphor particles to equal to or more than 5 μm, the transparency of a composite which will be described later can be further enhanced. On the other hand, by setting the average particle diameter of the α-sialon phosphor particles to equal to or less than 30 μm, it is possible to suppress the occurrence of chipping in a case where the composite is cut with a dicer or the like.

Here, the average particle diameter of the α-sialon phosphor particles means a median diameter ($D_{50}$) in a volume-based integrated fraction, determined by a laser diffraction scattering method in accordance with JIS R1629: 1997.

The shape of the α-sialon phosphor particle is not particularly limited. Examples of the shape include a spherical shape, a cubic shape, a columnar shape, and an amorphous shape.

Minute Recess Formed on Surface of α-Sialon Phosphor Particle

At least one minute recess is formed on the surface of each of the α-sialon phosphor particles. The presence or absence of the minute recess on the surface of the α-sialon phosphor particle can be confirmed by, for example, a scanning electron microscope (SEM). A diameter of the minute recess can be measured using an image obtained by SEM. The depth of the minute recess can be measured by a scanning atomic force microscope (AFM).

FIG. 1(a) is a schematic view of a minute recess provided on the surface of the α-sialon phosphor particle. As shown in FIG. 1(a), a minute recess 20 is a crater-shaped recess formed on the surface of an α-sialon phosphor particle 10.

As shown in FIG. 1(b), a diameter W of the minute recess 20 is the opening width of the minute recess 20 on the surface of the α-sialon phosphor particle 10. The diameter W of the minute recess 20 may vary depending on where a line for measuring the diameter is taken in a specific minute recess 20. A maximum diameter Wmax of the minute recess 20 is the maximum value among the diameters W of the minute recess 20. The α-sialon phosphor particle 10 preferably includes at least one minute recess 20 having a maximum diameter Wmax of equal to or more than 50 nm and equal to or less than 2,000 nm. The lower limit of the maximum diameter Wmax is more preferably equal to or more than 100 nm, and more preferably equal to or more than 150 nm. The upper limit of the maximum diameter Wmax is more preferably equal to or less than 1,500 nm, and more preferably equal to or less than 1,000 nm.

It is possible to further improve the fluorescence characteristics of the α-sialon phosphor particle 10 by setting the lower limit of the width Wmax of the minute recess 20 to the range.

In addition, it is possible to further improve the fluorescence characteristics of the α-sialon phosphor particle 10 while maintaining the intensity of the α-sialon phosphor particle 10 by setting the upper limit of the maximum diameter Wmax of the minute recess 20 to the range.

In a specific α-sialon phosphor particle 10, a plurality of minute recesses 20 having different maximum diameters Wmax may be formed on the surface of the particle. Specifically, it is preferable that the specific α-sialon phosphor particle 10 includes at least one minute recess having a maximum diameter Wmax of more than 1,000 nm and equal to or less than 2,000 nm, and also includes at least one minute recess having a maximum diameter Wmax of more than 500 nm and equal to or less than 1,000 nm.

In this manner, it is possible to further improve the fluorescence characteristics of the α-sialon phosphor particle 10.

Furthermore, in addition to the above, at least one minute recess having a maximum diameter Wmax of equal to or more than 50 nm and equal to or less than 500 nm is preferably included.

In this manner, it is possible to further improve the fluorescence characteristics of the α-sialon phosphor particle 10.

A depth D of the minute recess 20 is a length from the surface of the α-sialon phosphor particle 10 to the bottom of the minute recess 20 in one cross-section across the minute recess 20. The depth D of the minute recess 20 may vary depending on the cross-section of the specific minute recess 20.

In one cross-section across the minute recess 20, the lower limit of the depth D of the minute recess 20 is preferably equal to or more than 5 nm, more preferably equal to or more than 10 nm, and still more preferably equal to or more than 20 nm. On the other hand, the upper limit of the depth D of the minute recess 20 is preferably equal to or less than 500 nm, more preferably equal to or less than 400 nm, and still more preferably equal to or less than 300 nm. It is possible to further improve the fluorescence characteristics of the α-sialon phosphor particle 10 by setting the lower limit of the depth D to the range in one cross-section that crosses the minute recess 20.

In addition, it is possible to further improve the fluorescence characteristics of the α-sialon phosphor particle 10 while maintaining the intensity of the α-sialon phosphor particle 10 by setting the upper limit of the depth D of the minute recess 20 to the range.

It is preferable that the α-sialon phosphor particle 10 has a minute recess group 22 in which a plurality of minute recesses 20 are adjacent to each other on the surface of the particle.

An expression "the minute recesses 20 are adjacent to each other" means that a distance between the different minute recesses 20 is equal to or less than ½ of the maximum diameter Wmax of one of the minute recesses 20. A form in which two minute recesses 20 are connected to each other is also encompassed by the expression "the minute recesses 20 are adjacent to each other".

It is considered that it is possible to further improve the fluorescence characteristics of the α-sialon phosphor particle 10 by forming the minute recess group 22 on the surface of the α-sialon phosphor particle 10.

The lower limit of an area ratio of a region occupied by the plurality of minute recesses 20 on the surface of the α-sialon phosphor particle 10, that is, a ratio of the total area occupied by the plurality of minute recesses 20 on the surface area of the α-sialon phosphor particle 10 is preferably equal to or more than 10%, more preferably equal to or more than 12%, and still more preferably equal to or more than 15%. On the other hand, the upper limit of the ratio of the total area occupied by the plurality of minute recesses 20 is preferably equal to or less than 25%, more preferably equal to or less than 23%, and still more preferably equal to or less than 20%.

It is considered that the fluorescence characteristics are further improved by setting the lower limit of the ratio of the total area occupied by the plurality of minute recesses 20 to the range. On the other hand, it is easy to maintain the intensity of the α-sialon phosphor particle 10 by setting the upper limit of the ratio of the total area occupied by the plurality of minute recesses 20 to the range.

According to the phosphor particles described above, the fluorescence characteristics can be improved by incorporating a minute recess on the surface of each of the particles. In addition, the phosphor powder including the phosphor particles (having minute recesses) described above has the above-mentioned action and effect, that is, the action and effect of improving the fluorescence characteristics.

Method for Producing Phosphor Particle

A method for producing the α-sialon phosphor particle of the present embodiment will be described. In the α-sialon phosphor particle, apart of a raw material powder mainly undergoes a reaction to form a liquid phase, and each of the elements moves through the liquid phase in the synthesis process, whereby formation of a solid solution and grain growth proceed.

First, the raw materials including an element constituting the α-sialon phosphor particle containing Eu are mixed. Calcium is solid-dissolved at a high concentration in the α-sialon phosphor particles having a low oxygen content, which have been synthesized using calcium nitride as a calcium raw material. In particular, in a case where the Ca solid dissolution concentration is high, it is possible to obtain a phosphor having a light emission peak wavelength on a higher wavelength side (equal to or more than 590 nm, more specifically equal to or more than 590 nm and equal to or less than 610 nm, and still more specifically equal to or more than 592 nm and equal to or less than 608 nm) than that of a composition in the related art, using an oxide raw material. Specifically, in the general formula, it is preferable to satisfy $1.5 < x+y+z \leq 2.0$. It is also possible to finely tune the emission spectrum by partially substituting the elements of Ca with Li, Mg, Sr, Ba, Y, and lanthanide elements (except for La and Ce).

Examples of a raw material powder other than those include silicon nitride, aluminum nitride, and an Eu compound. Examples of the Eu compound include europium oxide, a compound that turns into europium oxide after heating, and europium nitride. Europium nitride, which can reduce the amount of oxygen in the system, is preferable.

In a case where an appropriate amount of the α-sialon phosphor particles previously synthesized is added to a raw material powder, this addition can serve as a base point of the grain growth to obtain α-sialon phosphor particles having relatively short-axis diameters, and the particle shapes can be controlled by changing the forms of the α-sialon particles to be added.

Examples of a method of mixing the above-mentioned respective raw materials include a dry mixing method and a method in which wet mixing is performed in an inert solvent that does not substantially react with the respective components of the raw materials, and then the solvent is removed. Examples of a mixing device include a V type mixer, a rocking mixer, a ball mill, and a vibrating mill. Mixing of calcium nitride which is unstable in the atmosphere is preferably performed in a glove box in an inert atmosphere since the hydrolysis and the oxidation of the substance give an influence on the characteristics of a synthetic product.

A container made of a material having a low reactivity with a raw material and a phosphor to be synthesized, for example, a container made of boron nitride is filled with a powder obtained by mixing (hereinafter simply referred to as a raw material powder). Then, the powder is heated for a predetermined time in a nitrogen atmosphere.

In this manner, an α-sialon phosphor can be obtained. A temperature for the heat treatment is preferably equal to or higher than 1,650° C. and equal to or lower than 1,950° C.

By setting the temperature for the heat treatment to equal to or higher than 1,650° C., it is possible to reduce the amount of residual unreacted products and make the primary particles sufficiently grow. In addition, by setting the temperature during the heat treatment to equal to or lower than 1,950° C., remarkable sintering between particles can be suppressed.

From the viewpoint of suppressing sintering between the particles during the heating, it is preferable that the container is filled with an increased volume of the raw material powder. Specifically, it is preferable that a bulk density at the time of filling the raw material powder in the container is set to equal to or less than 0.6 g/cm$^3$.

The heating time for the heat treatment is preferably equal to or more than 2 hours and equal to or less than 24 hours in terms of a time range during which there are no inconveniences such as presence of a large amount of unreacted substances, insufficient growth of primary particles, and sintering between the particles.

In the above-mentioned step, an α-sialon phosphor having an ingot-shaped outer form is produced. By subjecting this ingot-shaped α-sialon phosphor to a pulverizing step in which the phosphor is pulverized by a pulverizer such as a crusher, a mortar pulverizer, a ball mill, a vibrating mill, and a jet mill, and a sieve classification step after such the pulverizing treatment, it is possible to obtain a powder formed of α-sialon phosphor particles having an adjusted $D_{50}$ particle diameter of secondary particles. In addition, it is possible to adjust the $D_{50}$ particle diameter of the secondary particles by performing a step in which the phosphor powder is dispersed in an aqueous solution to remove the secondary particles which have small particle diameters and are hardly settled.

The α-sialon phosphor particle according to the present embodiment can be prepared by carrying out the above-mentioned steps and then carrying out an acid treatment step.

In the acid treatment step, for example, the α-sialon phosphor particle is immersed in an acidic aqueous solution. Examples of the acidic aqueous solution include an acidic aqueous solution including one kind of acid selected from acids such as hydrofluoric acid, nitric acid, and hydrochloric acid, and an aqueous mixed acid solution obtained by mixing two or more kinds of the acids. Among these, an aqueous hydrofluoric acid solution including hydrofluoric acid alone and an aqueous mixed acid solution obtained by mixing hydrofluoric acid and nitric acid are more preferable. The stock solution concentration of the acidic aqueous solution is appropriately set depending on the strength of an acid used, but is, for example, preferably equal to or more than 0.7% and equal to or less than 100%, and more preferably equal to or more than 0.7% and equal to or less than 40%. In addition, a temperature at which the acid treatment is carried out is preferably equal to or higher than 60° C. and equal to or lower than 90° C., and the reaction time (immersion time) is preferably equal to or more than 15 minutes and equal to or less than 80 minutes.

By performing the stirring at a high speed, the acid treatment on the particle surface is likely to be sufficiently performed. The term "high speed" as used herein depends on a stirring device used, but in a case where a laboratory-level magnetic stirrer is used, the stirring speed is, for example, equal to or more than 400 rpm, and in reality, equal to or more than 400 rpm and equal to or less than 500 rpm. For a common purpose of the stirring, which is to constantly supply a new acid to the particle surface, a stirring speed of approximately 200 rpm is sufficient, but by performing the stirring at a high speed of equal to or more than 400 rpm, the particle surface is likely to be sufficiently treated due to a physical action in addition to a chemical action.

The number, distribution method, diameter, and depth of minute recesses formed on the surface of α-sialon phosphor particle can be controlled by optimally adjusting the stock solution concentration of an acidic aqueous solution used for an acid treatment, the temperature during the acid treatment, a reaction time, and the like. For example, by adopting conditions which approximate to a combination of the stock solution concentration of an acidic aqueous solution used in Examples, a temperature during an acid treatment, and a reaction time, with reference to abundant Examples which will be described below, thus to carry out the acid treatment, it is possible to form a minute recess having a desired number, a desired distribution method, a desired diameter, and a desired depth on the surface of the α-sialon phosphor particle.

Composite

The composite according to an embodiment includes the above-mentioned phosphor particles and a sealing material that seals the phosphor particles. In the composite according to the present embodiment, a plurality of the above-mentioned phosphor particles are dispersed in the sealing material. As the sealing material, a well-known material such as a resin, a glass, and ceramics can be used. Examples of the resin used for the sealing material include transparent resins such as a silicone resin, an epoxy resin, and a urethane resin.

Examples of a method for manufacturing the composite include a manufacturing method in which a powder formed of α-sialon phosphor particles of the present embodiment is added to a liquid resin, a powdered glass, or ceramics, and the mixture is mixed uniformly, and then cured or sintered by a heat treatment.

Light-Emitting Device

Figure 2:
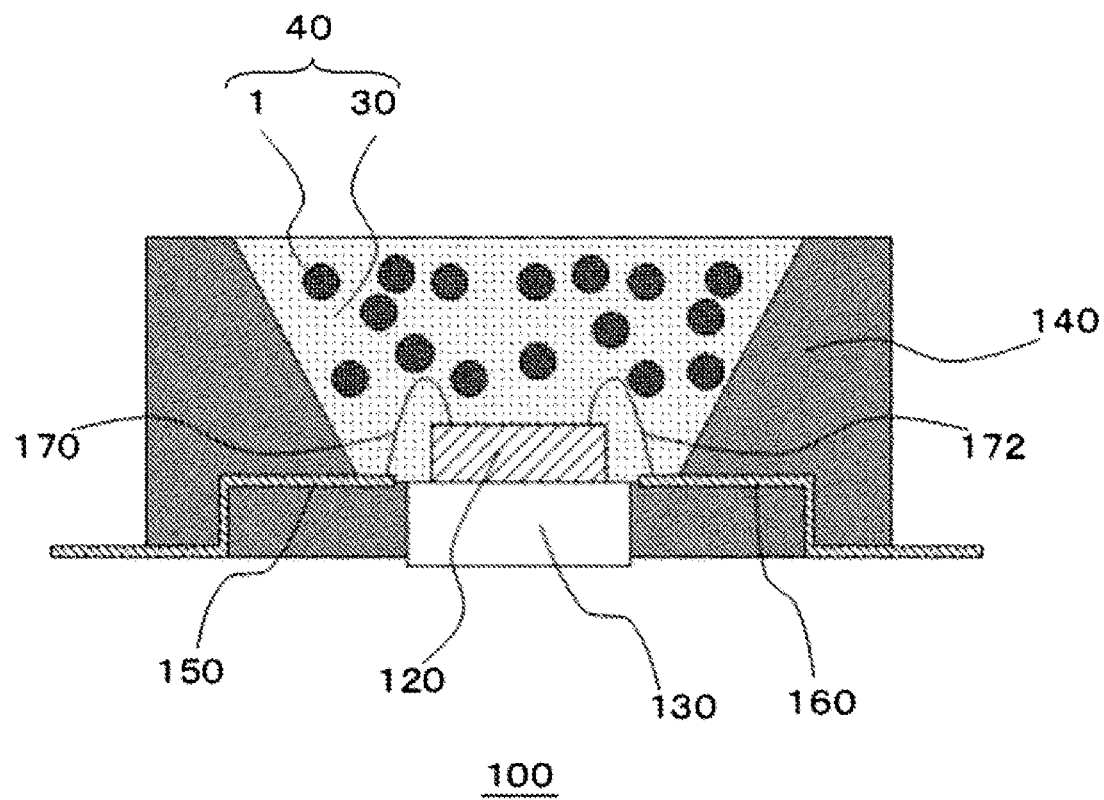
FIG. 2 is a schematic cross-sectional view showing a structure of a light-emitting device according to an embodiment.

FIG. 2 is a schematic cross-sectional view showing a structure of a light-emitting device according to the present embodiment. As shown in FIG. 2, a light-emitting device 100 includes a light-emitting element 120, a heat sink 130, a case 140, a first lead frame 150, a second lead frame 160, a bonding wire 170, a bonding wire 172, and a composite 40.

The light-emitting element 120 is mounted in a predetermined region on the upper surface of the heat sink 130. By mounting the light-emitting element 120 on the heat sink 130, the heat dissipation of the light-emitting element 120 can be enhanced. Further, a packaging substrate may be used instead of the heat sink 130.

The light-emitting element 120 is a semiconductor element that emits excitation light. As the light-emitting element 120, for example, an LED chip that generates light at a wavelength of equal to or more than 300 nm and equal to or less than 500 nm, corresponding to near-ultraviolet to blue light, can be used. One electrode (not shown in the drawings) arranged on the upper surface side of the light-emitting element 120 is connected to the surface of the first lead frame 150 through the bonding wire 170 such as a gold wire. In addition, the other electrode (not shown in the drawings) formed on the upper surface of the light-emitting element 120 is connected to the surface of the second lead frame 160 through the bonding wire 172 such as a gold wire.

In the case 140, a substantially funnel-shaped recess whose hole diameter gradually increases toward the upside from the bottom surface is formed. The light-emitting element 120 is provided on the bottom surface of the recess. The wall surface of the recess surrounding the light-emitting element 120 serves as a reflective plate.

The recess whose wall surface is formed by the case 140 is filled with the composite 40. The composite 40 is a wavelength conversion member that converts excitation light emitted from the light-emitting element 120 into light at a longer wavelength. The composite of the present embodiment is used as the composite 40, and the phosphor particles 1 of the present embodiment in a sealing material 30 such as a resin are dispersed. The light-emitting device 100 emits a mixed color of light of the light-emitting element 120 and light generated from the phosphor particles 1 that are excited by absorbing the light of the light-emitting element 120. The light-emitting device 100 preferably emits white light by the mixed color of the light of the light-emitting element 120 and the light generated from the phosphor particles 1.

In the light-emitting device 100 of the present embodiment, by using an α-sialon phosphor particle having a minute recess formed on the surface thereof as the phosphor particle 1 as mentioned above, the fluorescence characteristics of the phosphor particle 1 and the composite 40 can be improved, and an improvement of the light emission intensity of the light-emitting device 100 can be promoted.

FIG. 2 illustrates a surface mounting type light-emitting device. However, the light-emitting device is not limited to the surface mounting type. The light-emitting device may be of a cannonball type, a chip-on-board (COB) type, or a chip-scale-package (CSP) type.

The embodiments of the present invention have been described above, but these are examples of the present invention and various configurations other than the examples can also be adopted.

EXAMPLES

Hereinafter, the present invention will be described with reference to Examples and Comparative Examples, but the present invention is not limited thereto.

Example 1

In a glove box, 62.4 parts by mass of a silicon nitride powder (manufactured by Ube Kosan Co., Ltd., E10 grade), 22.5 parts by mass of an aluminum nitride powder (manufactured by Tokuyama Corporation, E grade), 2.2 parts by mass of an europium oxide powder (manufactured by Shin-Etsu Chemical Co., Ltd., RU grade), and 12.9 parts by mass of a calcium nitride powder (manufactured by Kojundo Chemical Lab. Co., Ltd.) were used as a blend composition of a raw material powder, and the raw material powders were dry-blended and then passed through a nylon-made sieve having a mesh size of 250 μm to obtain a raw material mixed powder. A cylindrical boron nitride-made container (manufactured by Denka Co., Ltd., N-1 grade) with a lid, having an internal volume of 0.4 liters, was filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and completely passed through a sieve having a mesh size of 150 μm to obtain a phosphor powder. With regard to this phosphor powder, the crystal phase was examined by powder X-ray diffraction measurement (X-ray Diffraction) using CuKα rays, and thus, the existing crystal phase was a Ca-α-sialon (α-sialon including Ca) containing an Eu element.

Next, 1.2 ml of 50% hydrofluoric acid and 2.8 ml of 70% nitric acid were mixed to obtain a mixed stock solution. 396 ml of distilled water was added to the mixed stock solution, and the concentration of the mixed stock solution was diluted to 1% to prepare 400 ml of an aqueous mixed acid solution. 30 g of a powder formed of the above-mentioned α-sialon phosphor particles was added to the aqueous mixed acid solution, the temperature of the aqueous mixed acid solution was kept at 80° C., and the mixture was subjected to an acid treatment in which the mixture was immersed for 30 minutes under stirring at a rotation speed of 450 rpm using a magnetic stirrer. The powder after the acid treatment was thoroughly washed with distilled water, filtered, dried, and then passed through a sieve having a mesh size of 45 μm to prepare a powder formed of the α-sialon phosphor particles of Example 1.

Example 2

A powder formed of α-sialon phosphor particles of Example 2 was manufactured by the same procedure as in Example 1, except that an aqueous mixed acid solution having a stock solution concentration of 1.0% was prepared by adding 396 ml of distilled water to a mixed stock solution obtained by mixing 2.0 ml of 50% hydrofluoric acid and 2.0 ml of 70% nitric acid, instead of the aqueous mixed acid solution used in Example 1.

Example 3

A powder formed of α-sialon phosphor particles of Example 3 was manufactured by the same procedure as in Example 1, except that an aqueous mixed acid solution having a stock solution concentration of 25% was prepared by adding 300 ml of distilled water to a mixed stock solution obtained by mixing 50 ml of 50% hydrofluoric acid and 50 ml of 70% nitric acid, instead of the aqueous mixed acid solution used in Example 1, and the phosphor powder was immersed for 60 minutes while maintaining the temperature of the aqueous mixed acid solution at 80° C.

Example 4

A powder formed of α-sialon phosphor particles of Example 4 was manufactured by the same procedure as in Example 1, except that an aqueous mixed acid solution having a stock solution concentration of 1.0% was prepared by adding 396 ml of distilled water to a mixed stock solution obtained by mixing 3.2 ml of 50% hydrofluoric acid and 0.8 ml of 70% nitric acid, instead of the aqueous mixed acid solution used in Example 1.

Example 5

A powder formed of α-sialon phosphor particles of Example 5 was manufactured by the same procedure as in Example 1, except that an aqueous hydrofluoric acid solution having a stock solution concentration of 25% was prepared by adding 300 ml of distilled water to 100 ml (stock solution) of 50% hydrofluoric acid, instead of the aqueous mixed acid solution used in Example 1.

Comparative Example 1

A powder formed of α-sialon phosphor particles of Comparative Example 1 was manufactured by the same procedure as in Example 1, except that an aqueous mixed acid solution having a stock solution concentration of 0.5% was used by adding 398 ml of distilled water to a mixed stock solution obtained by mixing 1.0 ml of 50% hydrofluoric acid and 1.0ml of 70% nitric acid, instead of the aqueous mixed acid solution used in Example 1, the temperature of the aqueous mixed acid solution was kept at 80° C., and the mixture was subjected to an acid treatment in which the aqueous mixed acid solution was immersed for 30 minutes under stirring at a rotation speed of 300 rpm using a magnetic stirrer.

In the method for manufacturing a powder formed of the α-sialon phosphor particles of Comparative Example 1, the stock solution concentration of the aqueous mixed acid solution used for the acid treatment was set to a level used in the related art.

Evaluation of Characteristics

Light Emission Characteristics

With regard to each of the obtained powders formed of α-sialon phosphors, the absorption rate, the internal quantum efficiency, and the external quantum efficiency were measured by a spectrophotometer (MCPD-7000 manufactured by Otsuka Electronics Co., Ltd.) and calculated by the following procedure.

A powder formed of the α-sialon phosphor particles of Examples or Comparative Example was filled so that the surface of a recess cell was smooth, and an integrating sphere was attached. Monochromatic light spectrally split into a wavelength of 455 nm from a light emission source (Xe lamp) was introduced into the integrating sphere using an optical fiber. A sample of the phosphor was irradiated with the monochromatic light as an excitation source, and measurement of the fluorescence spectrum of the sample was performed.

A standard reflective plate (Spectralon manufactured by Labsphere Inc.) having a reflectance of 99% was attached to a sample unit, and the spectrum of excitation light at a wavelength of 455 nm was measured. At that time, the number (Qex) of excitation light photons was calculated from a spectrum in the wavelength range of equal to or more than 450 nm and equal to or less than 465 nm.

A powder formed of the α-sialon phosphor particles was attached to the sample unit, and the number (Qref) of reflected excitation light photons and the number (Qem) of fluorescent light photons were calculated from the obtained spectral data. The number of reflected excitation light photons was calculated in the same wavelength range as the number of excitation light photons, and the number of fluorescent light photons was calculated in the range of equal to or more than 465 nm and equal to or less than 800 nm.

Absorption rate=$(Qex-Qref)/Qex \times 100$

Internal quantum efficiency=$(Qem/(Qex-Qref)) \times 100$

External quantum efficiency=$(Qem/Qex) \times 100$

In a case where the standard sample NSG1301 sold by Sialon Co., Ltd. was measured using the measurement method, the external quantum efficiency was 55.6% and the internal quantum efficiency was 74.8%. The device was calibrated using this sample as a standard.

Incidentally, the peak wavelengths of the emission spectra of the powders formed of the α-sialon phosphor particles of Examples 1 to 5, obtained by the measurement (wavelength of irradiated light: 455 nm), are each 600 nm (relatively high wavelength).

Measurement of Particle Size

A particle size was measured by a laser diffraction scattering method in accordance with JIS R1629: 1997, using Microtrac MT3300EX II (MicrotracBEL Corporation). 0.5 g of α-sialon phosphor particles were put into 100 cc of ion exchange water, the mixture was subjected to a dispersion treatment with Ultrasonic Homogenizer US-150E (Nissei Corporation, chip size: φ20 mm, Amplitude: 100%, oscillation frequency: 19.5 KHz, amplitude of vibration: about 31 μm) for 3 minutes, and then the particle size was measured with MT3300EX II. The median diameter $D_{50}$ was determined from the obtained particle size distribution.

Confirmation of Minute Recess

Figure 3:
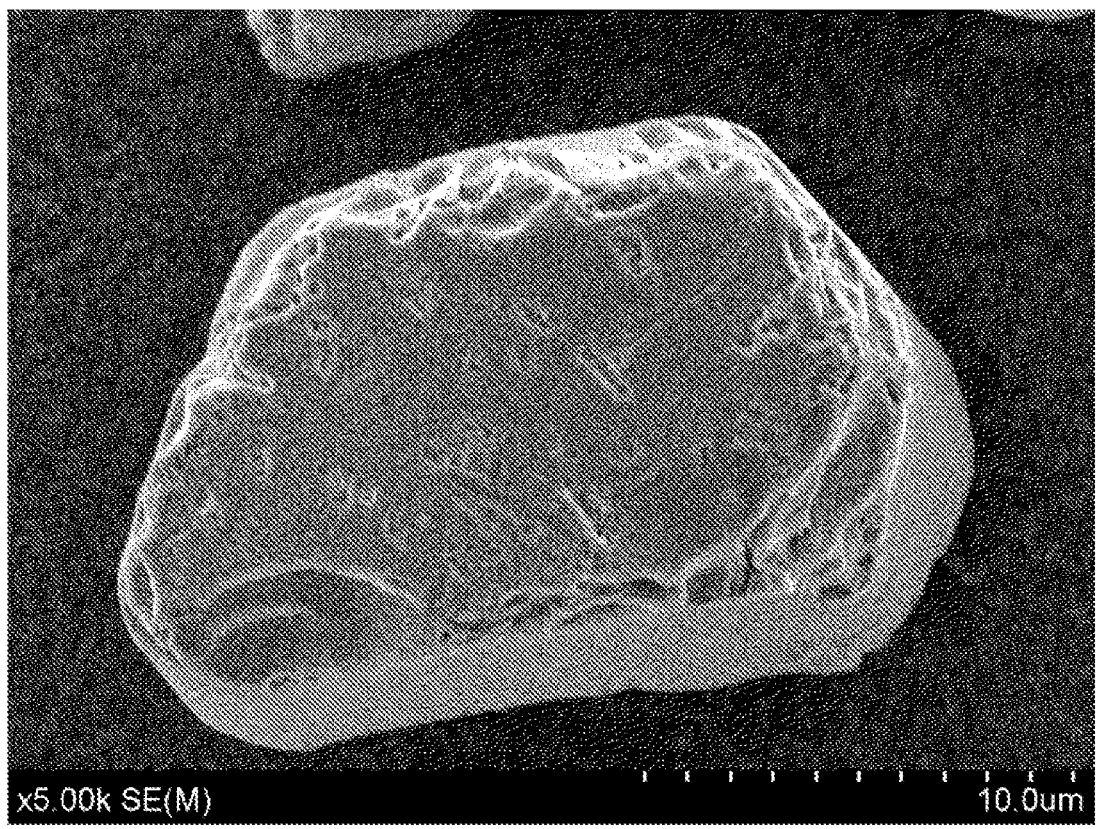
FIG. 3 is an SEM image of an α-sialon phosphor particle of Example 1.
Figure 4:
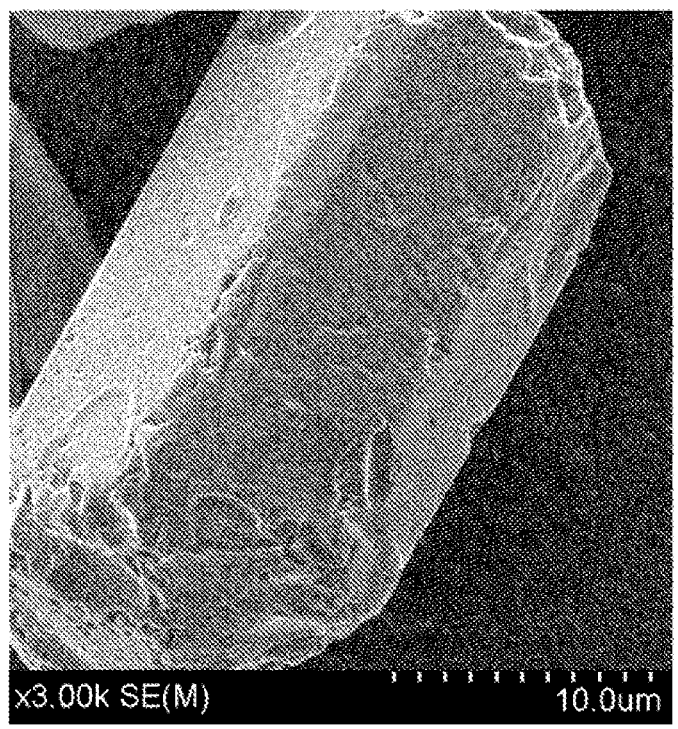
FIG. 4 is an SEM image of an α-sialon phosphor particle of Example 2.

With a scanning electron microscope (SEM), it was confirmed whether or not a minute recess was formed on the surface of an α-sialon phosphor particle. FIGS. 3 and 4 are SEM images of α-sialon phosphor particles of Example 1 and Example 2, respectively. As shown in FIGS. 3 and 4, in Examples 1 and 2, it was confirmed that minute recesses were formed on the surfaces of the α-sialon phosphor particles. More specifically, in both of Examples 1 and 2, it was confirmed that in addition to the isolated minute recesses, a minute recess group in which the minute recesses adjacent to each other was distributed.

In addition, it was confirmed that the α-sialon phosphor particles of Examples 3 to 5 also had minute recesses formed on the surfaces as in Examples 1 and 2.

In contrast, in Comparative Example 1, it was confirmed that there was no minute recess on the surface of the phosphor particle.

Measurement of Area and Dimension of Minute Recess

Figure 5:
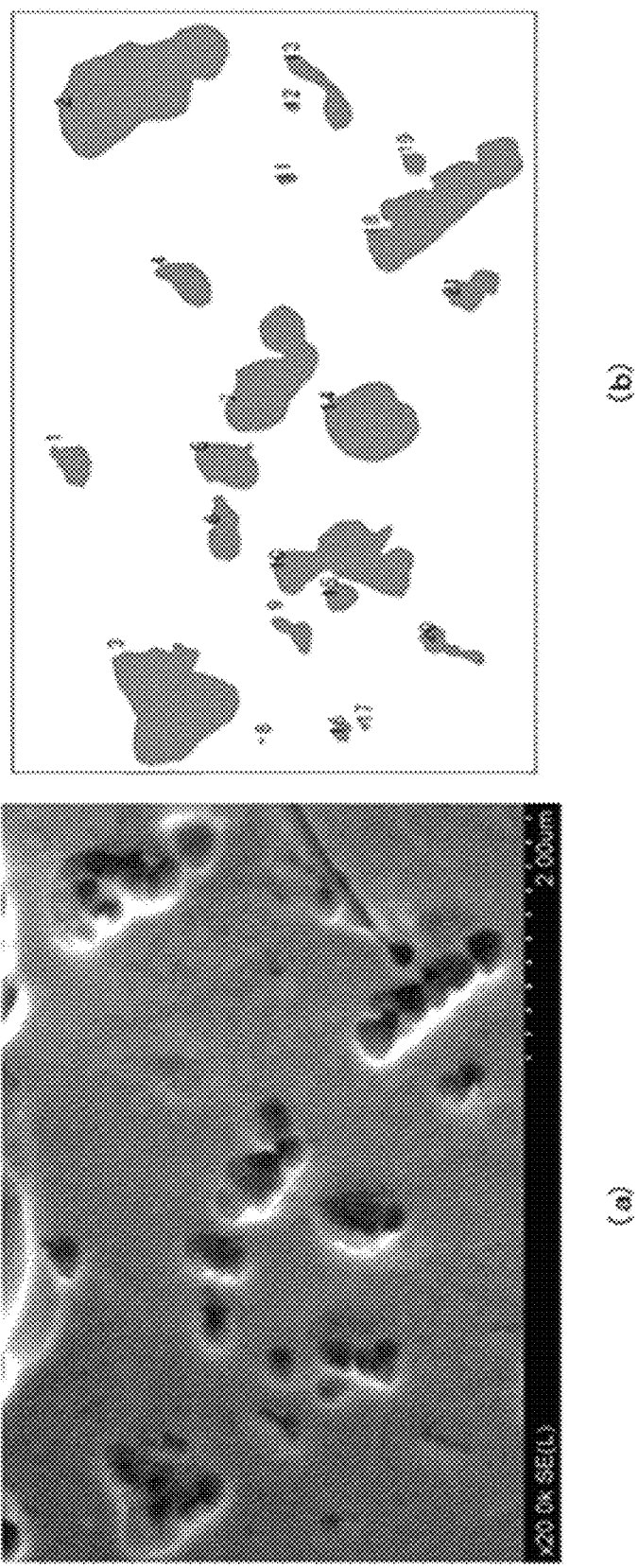
FIG. 5(a) is an SEM image of a region used for analysis of a minute recess of the α-sialon phosphor particle of Example 1.
FIG. 5(b) is a binarized image of a region used for the analysis of the minute recess of the α-sialon phosphor particle of Example 1.

In the SEM image of the α-sialon phosphor particle of Example 1, an analysis region (4.4 μm×6.4 μm) shown in FIG. 5(a) was binarized, and minute recesses were extracted (refer to FIG. 5(b)). As shown in FIG. 5(b), each of the extracted minute recesses is numbered, and a maximum diameter, a minimum diameter, an circle-equivalent diameter, an area, and an area ratio of each of the minute recesses were calculated using analysis software (Version 3.5, manufactured by Nippon Steel & Sumikin Technology Co., Ltd.).

Figure 6:
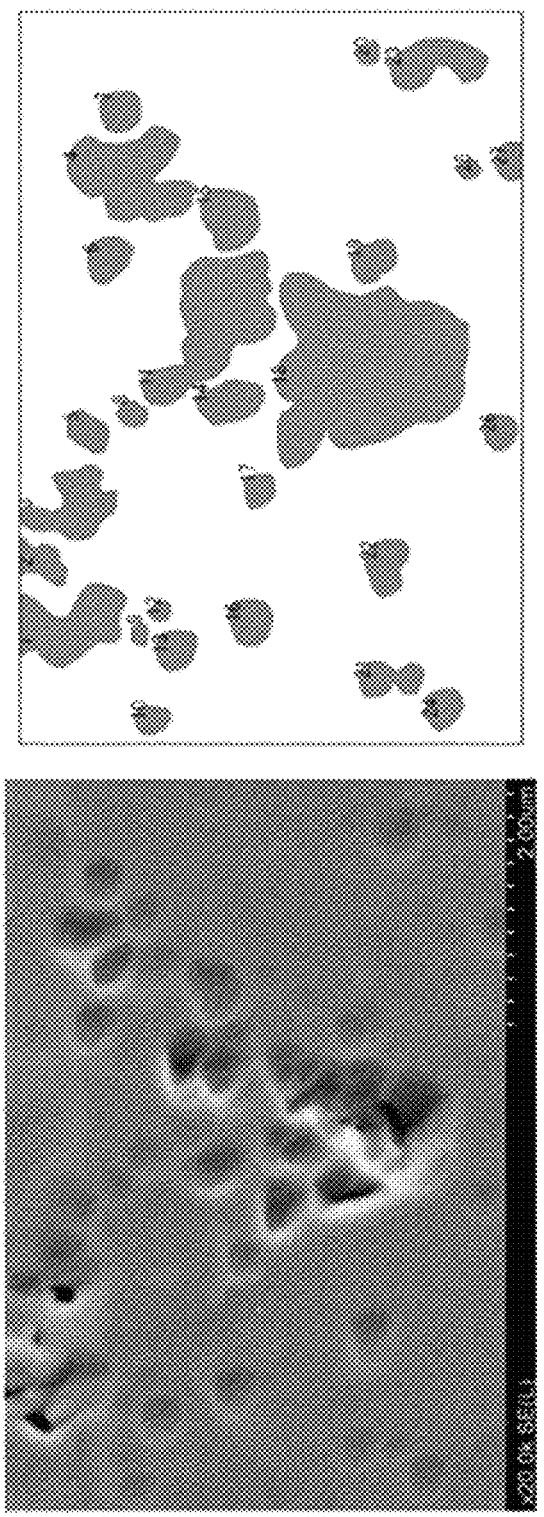
FIG. 6(a) is an SEM image of a region used for analysis of a minute recess of an α-sialon phosphor particles of Example 2.
FIG. 6(b) is a binarized image of the region used for the analysis of the minute recess of the α-sialon phosphor particle of Example 2.

Similarly, in the SEM image of the α-sialon phosphor particle of Example 2, an analysis region (4.4 μm×6.4 μm) shown in FIG. 6(a) was binarized, and minute recesses were extracted (refer to FIG. 6(b)). As shown in FIG. 6(b), each of the extracted minute recesses is numbered, and a maximum diameter, a minimum diameter, a circle-equivalent diameter, an area, and an area ratio using an analysis region (4.4 μm×6.4 μm) as a reference region, of each of the minute recesses, were calculated using the above-mentioned analysis software. Further, the area ratio of the region occupied by the minute recess in the reference region, with the analysis region (4.4 μm×6.4 μm) being used as the reference region, that is, a ratio of the total area occupied by the minute recess with respect to the area of the minute recesses with respect to the surface area of the α-sialon phosphor particle was calculated. The results obtained for the α-sialon phosphor particles of Examples 1 and 2 are shown in Tables 2 and 3, respectively.

Measurement of Depth of Minute Recess

For the α-sialon phosphor particles of Examples 1 and 2, the depths of the minute recesses numbered in FIGS. 5(b) and 6(b) were measured using a scanning atomic force microscope (AFM). The results obtained for the α-sialon phosphor particles of Examples 1 and 2 are shown in Tables 2 and 3, respectively.

TABLE 1

| | | | Example 1 | Example 2 | Example 3 | Example 4 | Example 5 | Comparative Example 1 |
|---|---|---|---|---|---|---|---|---|
| Acid treatment | Acid solution | 50% Hydrofluoric acid (ml) | 1.2 | 2.0 | 50 | 3.2 | 100 | 1.0 |
| | | 70% Nitric acid (ml) | 2.8 | 2.0 | 50 | 0.8 | 0 | 1.0 |
| | | Liquid ratio (amount of hydrofluoric acid:amount of nitric acid) | 3:7 | 5:5 | 5:5 | 8:2 | 10:0 | 5:5 |
| | | Distilled water (ml) | 396 | 396 | 300 | 396 | 300 | 398 |
| | | Stock solution concentration (%) | 1.0 | 1.0 | 25 | 1.0 | 25 | 0.5 |
| | Reaction conditions | Temperature (° C.) | 80 | 80 | 80 | 80 | 80 | 80 |
| | | Time (min) | 30 | 30 | 60 | 30 | 30 | 30 |
| Particle size | | $D_{50}$ (μm) | 14.5 | 16.2 | 16.3 | 15.6 | 14.3 | 15.6 |
| Surface shape | | Presence or absence of minute recess | Present | Present | Present | Present | Present | Absent |
| Light emission characteristics | | Absorption rate (%) | 88.4 | 89.3 | 87.7 | 88.9 | 88.2 | 89.1 |
| | | Internal quantum efficiency (%) | 80.3 | 79.5 | 77.1 | 79.9 | 80.2 | 73.7 |
| | | External quantum efficiency (%) | 71.0 | 71.1 | 67.6 | 71.0 | 70.7 | 65.7 |

TABLE 2

| No. of minute recesses | Area (μm$^2$) | Area ratio (%) | Maximum diameter (nm) | Minimum diameter (nm) | Circle-equivalent diameter (nm) | AFM: Depth (nm) |
|---|---|---|---|---|---|---|
| 1 | 0.085 | 0.30 | 440.4 | 291.2 | 329.2 | 120.6 |
| 2 | 0.926 | 3.29 | 1,616.3 | 778.6 | 1085.6 | 344.9 |
| 3 | 0.710 | 2.52 | 1,157.6 | 982.4 | 950.4 | 313.4 |
| 4 | 0.114 | 0.41 | 549 | 300.3 | 380.8 | 48.6 |
| 5 | 0.170 | 0.60 | 605.4 | 387.7 | 464.6 | 154.7 |
| 6 | 0.115 | 0.41 | 566.4 | 281.8 | 383.3 | 146.4 |
| 7 | 0.479 | 1.70 | 1,134.4 | 609.3 | 781.1 | 279.1 |
| 8 | 0.002 | 0.01 | 68.1 | 47.2 | 55.2 | 7.8 |
| 9 | 0.059 | 0.21 | 436.8 | 226.5 | 274 | 87.5 |
| 10 | 0.469 | 1.67 | 1,209.4 | 641.1 | 772.4 | 225.3 |
| 11 | 0.012 | 0.04 | 176.1 | 87.4 | 125.3 | 35.3 |
| 12 | 0.007 | 0.02 | 125.2 | 81 | 94.5 | 28.6 |
| 13 | 0.121 | 0.43 | 776.3 | 254 | 392.4 | 86.6 |
| 14 | 0.394 | 1.40 | 833 | 654.7 | 708.2 | 227.8 |
| 15 | 0.053 | 0.19 | 290.7 | 236.1 | 259.9 | 94.6 |
| 16 | 0.021 | 0.07 | 185.4 | 155 | 161.6 | 28.7 |
| 17 | 0.005 | 0.02 | 105.6 | 75.3 | 82.8 | 13.2 |
| 18 | 0.606 | 2.15 | 1,586.5 | 545.8 | 878.2 | 392.5 |
| 19 | 0.031 | 0.11 | 254.3 | 187.4 | 200.1 | 324.9 |
| 20 | 0.071 | 0.25 | 572.9 | 230.6 | 299.6 | 33.7 |
| 21 | 0.099 | 0.35 | 481.1 | 286.7 | 354.4 | 162.7 |
| Minimum value | 0.002 | 0.01 | 68.1 | 47.2 | 55.2 | 7.8 |
| Maximum value | 0.926 | 3.29 | 1,616.3 | 982.4 | 1,085.6 | 392.5 |
| Total | 4.548 | 16.18 | | | | |

TABLE 3

| No. of minute recesses | Area ($\mu m^2$) | Area ratio (%) | Maximum diameter (nm) | Minimum diameter (nm) | Circle-equivalent diameter (nm) | AFM: Depth (nm) |
|---|---|---|---|---|---|---|
| 1 | 0.448 | 1.59 | 1072.3 | 706 | 755.6 | — |
| 2 | 0.115 | 0.41 | 575.1 | 336.5 | 382.7 | — |
| 3 | 0.331 | 1.18 | 900 | 640.5 | 648.7 | — |
| 4 | 0.635 | 2.26 | 1186.6 | 829.4 | 898.9 | 42.7 |
| 5 | 0.107 | 0.38 | 456.8 | 300.5 | 369.1 | — |
| 6 | 0.133 | 0.47 | 472.4 | 382.1 | 411.7 | 23.5 |
| 7 | 0.118 | 0.42 | 418.1 | 374.1 | 387.1 | 25.4 |
| 8 | 0.054 | 0.19 | 293.9 | 244.6 | 262.5 | 11.9 |
| 9 | 0.029 | 0.10 | 226 | 163.1 | 193.5 | 3.5 |
| 10 | 0.069 | 0.25 | 342.4 | 261.8 | 297.4 | 8.9 |
| 11 | 0.840 | 2.99 | 1669.5 | 932.1 | 1033.9 | 119.6 |
| 12 | 0.031 | 0.11 | 221.2 | 193 | 200 | 4.0 |
| 13 | 0.112 | 0.40 | 419.9 | 361.1 | 376.9 | 22.1 |
| 14 | 0.181 | 0.65 | 627.7 | 377 | 480.6 | 41.9 |
| 15 | 0.230 | 0.82 | 597.8 | 506.7 | 540.9 | 30.4 |
| 16 | 0.137 | 0.49 | 452.1 | 399.2 | 417.4 | 19.7 |
| 17 | 0.073 | 0.26 | 362.3 | 286.3 | 305.4 | 15.9 |
| 18 | 2.075 | 7.38 | 2057.6 | 1637.7 | 1625.5 | 220.2 |
| 19 | 0.124 | 0.44 | 474.2 | 350.7 | 396.7 | 17.5 |
| 20 | 0.034 | 0.12 | 249 | 200.4 | 208 | 3.1 |
| 21 | 0.144 | 0.51 | 601.6 | 334 | 428.6 | 10.0 |
| 22 | 0.155 | 0.55 | 547.9 | 391.9 | 443.5 | 31.8 |
| 23 | 0.270 | 0.96 | 891.4 | 444.7 | 586.3 | 19.8 |
| 24 | 0.100 | 0.36 | 409.2 | 339.7 | 356.9 | 13.1 |
| 25 | 0.031 | 0.11 | 218.1 | 184.5 | 197.4 | 5.6 |
| 26 | 0.082 | 0.29 | 347.9 | 313.3 | 323.9 | 12.8 |
| 27 | 0.071 | 0.25 | 360.4 | 236.1 | 301.5 | 16.2 |
| Minimum value | 0.029 | 0.10 | 218.1 | 163.1 | 193.5 | 3.1 |
| Maximum value | 2.075 | 7.38 | 2057.6 | 1637.7 | 1625.5 | 220.2 |
| Total | 6.729 | 23.94 | | | | |

*In Nos. 1 to 3, and 5, the depth was immeasurable by AFM due to the presence of an inclination.

As shown in Table 1, it was confirmed that in each of the α-sialon phosphor particles of Examples 1 to 5, having a minute recess formed on the surface thereof, both the internal quantum efficiency and the external quantum efficiency were higher than those of Comparative Example 1, and the fluorescence characteristics were improved. In addition, it was confirmed that the fluorescence characteristics are improved by incorporating the following minute recesses in the α-sialon phosphor particles of Examples 1 and 2.

The depth is equal to or more than 5 nm and equal to or less than 500 nm in one cross-section that crosses the minute recess.

The α-sialon phosphor particle includes at least one minute recess having a maximum diameter of equal to or more than 50 nm and equal to or less than 2,000 nm.

The α-sialon phosphor particle includes at least one minute recess having a maximum diameter of more than 1,000 nm and equal to or less than 2,000 nm, and at least one minute recess having a maximum diameter of more than 500 nm and equal to or less than 1,000.

The α-sialon phosphor particle includes at least one minute recess having a maximum diameter of equal to or more than 50 nm and equal to or less than 500 nm.

Additional Comparative Example: Example in which Acid Treatment Condition was Changed in Example 1

Figure 7:
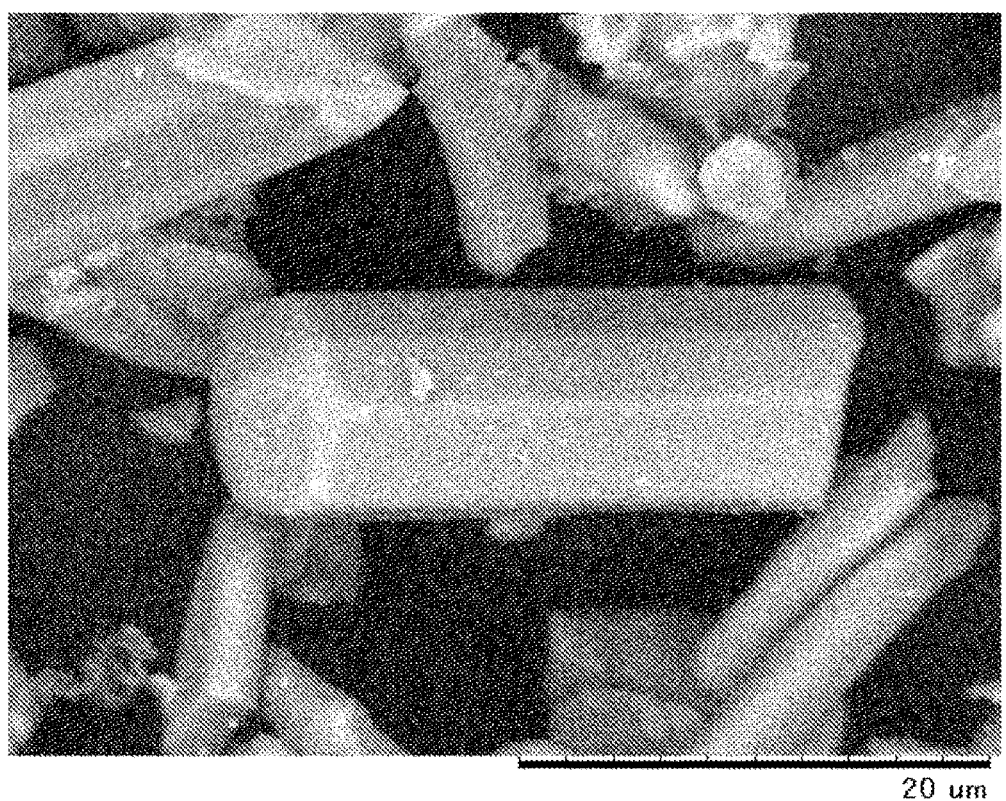
FIG. 7 is an SEM image of an α-sialon phosphor particle of Additional Comparative Example.
Figure 8:
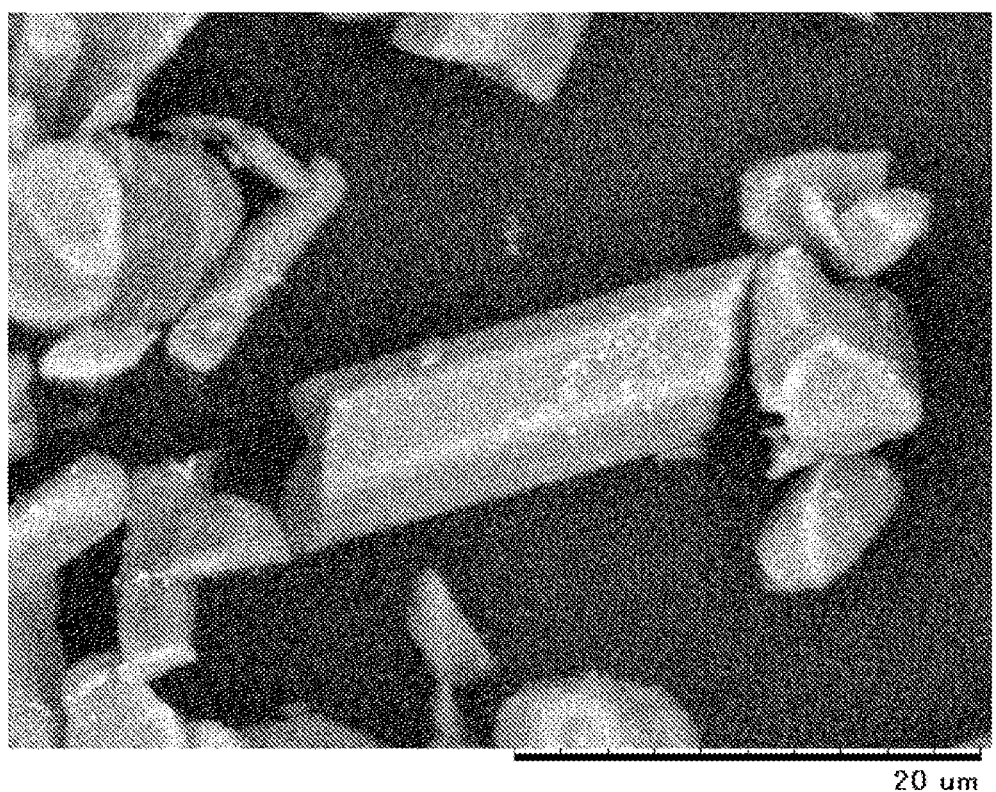
FIG. 8 is an SEM image of an α-sialon phosphor particle of Additional Comparative Example.

Phosphor particles formed of the α-sialon phosphor particles were obtained in the same manner as in Example 1, except that the stirring speed by the magnetic stirrer was changed from 450 rpm to 200 rpm which was a normal level. The median diameter D50 of the phosphor particles obtained in this Additional Comparative Example was 14.5 μm. Then, the obtained phosphor particles were observed by SEM in various fields of view, but there were no phosphor particles having minute recesses formed on the surface thereof. For reference, the SEM images of the obtained phosphor particles are shown in FIGS. 7 and 8.

In addition, for the phosphor particles obtained in Additional Comparative Example, the internal quantum efficiency was 75.4%, and the external quantum efficiency was 66.6%, which were deteriorated in the level of Example 1 (and other Examples).

This application claims priority based on Japanese Application Japanese Patent Application No. 2019-069106 filed on Mar. 29, 2019, the disclosures of which are incorporated herein by reference in their entireties.

REFERENCE SIGNS LIST

1: phosphor particle
10: α-sialon phosphor particle
20: minute recess
22: minute recess group
30: sealing material
40: composite
100: light-emitting device
120: light-emitting element
130: heat sink
140: case
150: first lead frame
160: second lead frame
170: bonding wire
172: bonding wire

The invention claimed is:

1. An α-sialon phosphor particle containing Eu,
   wherein at least one minute recess is formed on a surface of the α-sialon phosphor particle;
   wherein in one cross-section that crosses the minute recess, a depth is equal to or more than 5 nm and equal to or less than 500 nm,
   wherein the α-sialon phosphor particle is formed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, x=0, 0<y<2.0, 0<z≤0.5, 0<z+y, 0.3≤x+y+z≤2.0, 0<m≤4.0, and 0<n≤3.0 are satisfied, and
   wherein the α-sialon phosphor particle is comprised in a collection of α-sialon phosphor particles, the collection of α-sialon phosphor particles having an average particle diameter in the range of from 1 μm to 20 μm.

2. The phosphor particle according to claim 1,
   wherein the α-sialon phosphor particle includes at least one minute recess having a maximum diameter of equal to or more than 50 nm and equal to or less than 2,000 nm.

3. The phosphor particle according to claim 2,
   wherein the α-sialon phosphor particle includes at least one minute recess having a maximum diameter of more than 1,000 nm and equal to or less than 2,000 nm, and at least one minute recess having a maximum diameter of more than 500 nm and equal to or less than 1,000 nm.

4. The phosphor particle according to claim 2,
   wherein the α-sialon phosphor particle includes at least one minute recess having a maximum diameter of equal to or more than 50 nm and equal to or less than 500 nm.

5. The phosphor particle according to claim 1,
   wherein the α-sialon phosphor particle has a minute recess group in which a plurality of the minute recesses are adjacent to each other.

6. The phosphor particle according to claim 1,
   wherein an area ratio of a region occupied by the minute recess on the surface of the α-sialon phosphor particle is equal to or more than 10% and equal to or less than 25%.

7. A composite comprising:
   a plurality of phosphor particles; and
   a sealing material that seals the phosphor particles of the plurality of phosphor particles; wherein
   the plurality of phosphor particles is a collection of particles that has an average particle diameter in the range of from 1 μm to 20 μm; and
   each particle of the plurality of phosphor particles is α-sialon phosphor particle containing Eu,
      wherein at least one minute recess is formed on a surface of the α-sialon phosphor particle;
      wherein in one cross-section that crosses the minute recess, a depth is equal to or more than 5 nm and equal to or less than 500 nm, and
      wherein the α-sialon phosphor particle is formed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, x=0, 0<y<2.0, 0<z≤0.5, 0<z+y, 0.3≤x+y+z≤2.0, 0<m≤4.0, and 0<n≤3.0 are satisfied.

8. A light-emitting device comprising:
   a light-emitting element that emits excitation light; and
   the composite according to claim 7, that converts a wavelength of the excitation light.

9. A method for producing the phosphor particle according to claim 1, comprising:
   mixing raw material containing an element constituting an α-sialon phosphor particle containing Eu;
   heating a mixture of the raw materials to obtain an α-sialon phosphor;
   pulverizing the α-sialon phosphor obtained by the heating to obtain the α-sialon phosphor particle; and
   subjecting the α-sialon phosphor particle obtained by pulverization to an acid treatment to form a minute recess on a surface of the α-sialon phosphor particle.

* * * * *